(12) United States Patent
Horiuchi

(10) Patent No.: US 7,893,471 B2
(45) Date of Patent: Feb. 22, 2011

(54) SEMICONDUCTOR APPARATUS WITH A CRYSTALLINE DIELECTRIC FILM AND METHOD OF MANUFACTURING SAID SEMICONDUCTOR APPARATUS

(75) Inventor: Satoshi Horiuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 366 days.

(21) Appl. No.: 11/708,467

(22) Filed: Feb. 21, 2007

(65) Prior Publication Data
US 2007/0212843 A1 Sep. 13, 2007

(30) Foreign Application Priority Data
Feb. 28, 2006 (JP) .................. P2006-051895

(51) Int. Cl.
*H01L 21/02* (2006.01)

(52) U.S. Cl. .................. 257/295; 257/E21.009; 257/E21.272

(58) Field of Classification Search .......... 438/3; 257/295, 310, 532, E21.009, E21.272
See application file for complete search history.

(56) References Cited

U.S. PATENT DOCUMENTS

| 5,617,290 A | * | 4/1997 | Kulwicki et al. | ......... 361/321.4 |
| 6,882,516 B2 | * | 4/2005 | Baniecki et al. | ......... 361/321.1 |

FOREIGN PATENT DOCUMENTS

| JP | 11-204745 | 7/1999 |
| JP | 2002-353208 A | 12/2002 |
| JP | 2003-224123 | 8/2003 |

OTHER PUBLICATIONS

Chongi et al., A Study on the Fatigue Characteristics of PZT Thin Films for Ferroelectric Memory, vol. 44, pp. 1643-1648.*
Horikawa et al., T., "$(Ba_{0.75}Sr_{0.25})TiO_3$ Films for 256 Mbit DRAM", IEICE Trans. Electron., vol. E77-C, No. 3, Mar. 1994.
Horikawa et al. "Effects of Post-Annealing on Dielectric Properties of $(Ba, Sr) TiO_3$ Thin Films Prepared by Liquid Source Chemical Vapor Deposition", IEICE (The Institute of Electronics, Information and Communication Engineers) Trans Electron vol. E81-C, No. 4, pp 497-504, 1998.

* cited by examiner

*Primary Examiner*—Brook Kebede
(74) *Attorney, Agent, or Firm*—Rader, Fishman & Grauer PLLC

(57) ABSTRACT

A semiconductor apparatus is proposed which is provided with a crystalline dielectric film having a perovskite structure, between electrodes. The semiconductor apparatus includes at least a discontinuous interface through which crystallinity becomes discontinuous, in a columnar crystal portion of the crystalline dielectric film.

15 Claims, 8 Drawing Sheets

SEMICONDUCTOR APPARATUS WITH A CRYSTALLINE DIELECTRIC FILM AND METHOD OF MANUFACTURING SAID SEMICONDUCTOR APPARATUS

BACKGROUND OF THE INVENTION

1. Field of the Invention

The present invention relates to a semiconductor apparatus using a crystalline metal oxide film as a dielectric film and a method of manufacturing the semiconductor apparatus.

2. Description of Related Art

Silicon nitride ($Si_3N_4$) films or silicon oxide ($SiO_2$) films have hitherto been used as dielectric films which are used to make a capacitor device and the gate insulating films of transistors in a large-scale integrated circuit (hereinafter called "LSI").

As the LSI becomes increasingly denser, the area occupied by its capacitor device needs to be reduced. On the other hand, aiming to diversify the application and reduce the cost of the capacitor device so as to be suited for more sophisticated functions of the LSI, a capacitor so far external to the LSI has come to be incorporated into the LSI, exhibiting a tendency that the capacitance in the LSI is increasing. In order to ensure the capacitance requirements while limiting the occupancy of the capacitor device, it is effective to use a material having a high dielectric constant as a dielectric film for forming the capacitor device.

As dielectric films having a high dielectric constant, attention has been paid recently to tantalum oxide ($Ta_2O_5$), hafnium oxide ($HfO_2$), zirconium oxide ($ZrO_2$), aluminum oxide ($Al_2O_3$), and the like. Development has been made positively on their applications not only to gate insulating films but also to dielectric films as capacitor devices. These materials are used generally in an amorphous phase. For example, although hafnium oxide ($HfO_2$) and the like are easy to crystallize, they are often used with an element such as silicon (Si) added thereto in order to prevent their crystallization.

The typical dielectric constants of these materials are shown below. These are approximate values obtained in the amorphous phase, since the dielectric constant actually depends on the impurity concentration in a film and the film density, attributable to a material of which the film is formed.

TABLE 1

| Name of material | dielectric constant |
| --- | --- |
| silicon oxide ($SiO_2$) | approx. 4 |
| silicon nitride ($Si_3N_4$) | approx. 7 |
| aluminum oxide ($Al_2O_3$) | approx. 9 |
| zirconium oxide ($ZrO_2$) | 15 to 22 |
| hafnium oxide ($HfO_2$) | 15 to 22 |
| tantalum oxide ($Ta_2O_3$) | 22 to 30 |

As a material exhibiting even higher dielectric properties than the above-mentioned materials, a crystalline dielectric film is known. For example, strontium titanate ($SrTiO_3$, hereinafter abbreviated as STO), barium titanate ($BaTiO_3$, hereinafter abbreviated as BTO), barium strontium titanate ($Ba_xSr_{1-x}TiO_3$, hereinafter abbreviated as BST) being a crystal mixed with BTO, zirconium lead titanate ($PbZr_xTi_{1-x}O_3$, hereinafter abbreviated as PZT) having superior ferroelectric properties, and the like have been under research and development, and on the basis of that, studies on their physical properties have been in progress toward their practical application.

These crystalline dielectric films have a crystal structure called a perovskite structure, and their dielectric constant is known to be dependent on their crystallinity (see, e.g., the following Non-Patent Document 1).

[Non-Patent Document 1] Tsuyoshi HORIKAWA, Noboru MIKAMI, Hiromi ITO, Yoshikazu OHNO, Tetsuro MAKITA, Kazunao SATO, "($Ba_{0.75}Sr_{0.25}$)$TiO_3$ Films for 256 Mbit DRAM", IEICE (The Institute of Electronics, Information and Communication Engineers) TRANS ELECTRON, Vol. E77-C, No. 3, pp. 385-391, 1994

In the perovskite structure, better crystallinity exhibits a higher dielectric constant. This is understood as the phenomenon of ion polarization. Since the dielectric constants of the crystalline dielectric films respectively exhibit a large dependence on crystallinity, it is hard to give their dielectric constants summarily. However, if the films are so crystalline that they exhibit such superiority as to be highly dielectric thin films, their dielectric constants are approximately 50 to 100.

When a capacitor device having a high capacitance density is to be formed by using such a crystalline dielectric film, a film having satisfactory crystallinity must be formed. To do so, two requirements must be met.

The first requirement is to form the film at a sufficiently high temperature, which is a requirement common to any crystalline growth. Although the relation of temperature with crystallinity depends on a material used, there have been many reports that in the case of STO and BST films, their film forming temperature is generally about 500-800° C., including the subsequent heat treatment.

The second requirement is the lattice matching of the film with a surface material of a film forming substrate. Considering the formation of a capacitor device using a crystalline dielectric film from this viewpoint, a material exhibiting satisfactory lattice matching with the crystalline dielectric film is optimal as the surface material of a lower electrode. Generally, a metal material, such as platinum (Pt) or ruthenium (Ru), or a conductive oxide film, such as a ruthenium oxide film ($RuO_2$), a strontium ruthenium oxide film ($SrRuO_3$), or the like is used. Examples have been disclosed, which indicate the importance of lattice constant and lattice matching with an underlayer (see, e.g., Patent Document 1).

[Patent Document 1] Japanese Patent Application Publication No. 11-204745

However, even if such a material exhibiting satisfactory lattice matching is used to form the lower electrode, the crystalline dielectric film is generally known to have a tendency that its crystallinity is unsatisfactory initially, but it gradually improves thereafter in the film formation through its self lattice matching. Therefore, the film exhibits a low dielectric constant in its initially grown, less crystalline region and a high dielectric constant in its upper layer with improved crystallinity.

A method of forming a capacitor device aiming to decrease the surface area of an LSI involves forming the capacitor device between layers that have been formed after an interconnect process. By doing so, other devices such as, e.g., transistors can be formed even below the capacitor device, and hence such a method is effective. Also, the formation of a capacitor device between layers allows easy formation of a MIM (Metal Insulator Metal) structure in part of which upper and lower electrodes or existing interconnections are used. This implements a sufficiently low interconnection resistance, and hence is advantageous in high-frequency device applications.

However, in forming the capacitor device after the interconnect process, the maximum device forming temperature is restricted, and hence the device must be formed below 350-400° C., in consideration of the problems of the reliability of the interconnections and the performance fluctuations of the other devices. However, at a temperature within the above-mentioned range, the crystallinity of the crystalline dielectric film is impaired as compared with that formed at high temperature, and hence the dielectric constant is decreased.

The crystalline dielectric film having a perovskite structure exhibits a superior dielectric constant, as mentioned above. In order to obtain such a crystalline dielectric film, technologies have been developed Which involve methods using organic materials, such as a chemical vapor deposition (CVD) method (see, e.g., Patent Document 2), an atomic layer deposition (ALD) method, and a sol-gel process (see, e.g., Patent Document 3).

[Patent Document 2] Japanese Patent Application Publication No. 2002-353208

[Patent Document 3] Japanese Patent Publication No. 3152135

While these film forming methods employing organic materials have a feature of superior step coverage, they also have a problem that organic components, such as carbon and hydrogen, contained in a film forming material remain in the film. For example, in forming a dielectric film using an organic material, it is generally known that impurities such as carbon and hydrogen increase leakage current. Additionally, the presence of such impurities impedes crystal growth and invites the dielectric constant to decrease.

Since the organic components remain more noticeably in low-temperature film formation, it is a must to form the film at high temperature. However, it becomes difficult to form the capacitor device between the layers produced after the existing interconnect process, since high-temperature processing is involved. Meanwhile, film formation based on a sputtering method (see, e.g., Patent Document 4) is effective in crystal growth in the sense that it can avoid the influence of the organic components that remain.

[Patent Document 4] Japanese Patent Application Publication No. 2003-224123

The crystallinity of the crystalline dielectric film is unsatisfactory initially, but it gradually improves thereafter in the film formation through self lattice matching. The film exhibits a low dielectric constant in its initially grown, less crystalline region, whereas it exhibits a high dielectric constant in its upper layer with improved crystallinity. Furthermore, the crystalline dielectric film is known to have a tendency that its current leakage characteristics depend on the crystallinity. For example, when attention is paid to BST as a crystalline dielectric material, many examples of experiments have been reported in which the dielectric constant increases with increasing film forming temperature, and so does leakage current (see, e.g., Non-Patent Document 2). In other words, the initially grown film exhibits a quality that decreases the leakage current. This tendency becomes more noticeable at lower crystalline dielectric film forming temperatures. A similar tendency is observed also in an RF sputtering method, which is known as a superior low-temperature film forming method.

[Non-Patent Document 2] Tsuyoshi HORIKAWA, Junji TANIMURA, Takaaki KAWAHARA, Mikio YAMAMURA, Masayoshi TARUTANI, Kouichi ONO, "Effects of Post-Annealing on Dielectric Properties of (Ba, Sr)TiO$_3$ Thin Films Prepared by Liquid Source Chemical Vapor Deposition", IEICE (The Institute of Electronics, Information and Communication Engineers) TRANS ELECTRON, Vol. E81-C, No. 4, pp. 497-504, 1998

When the capacitor device is to be formed using the crystalline dielectric film as a capacitor insulating film, the crystallinity of the crystalline dielectric film (e.g., a BST film or the like) differs at a lower electrode interface and at an upper electrode interface, with the crystallinity being more satisfactory at the upper electrode interface than at the lower electrode interface. From this, the dependence of the current leakage characteristics on the direction in which bias is applied on the electrodes. A direction in which electrons are injected from the lower electrode, i.e., a state in which a positive bias is applied on the upper electrode is denoted as a "positive bias", whereas a state in which a negative bias is applied on the upper electrode is denoted as a "negative bias".

The structure of a capacitor device whose current leakage characteristics were evaluated is shown in FIG. 1, which is a cross section showing a general configuration. The directions of electron injection based on the biasing directions are shown in FIG. 3. An example of the dependence of the current leakage characteristics on biasing is shown in FIG. 4.

As shown in FIG. 1, the capacitor device has a structure in which a BST film 130 is interposed between a lower electrode 120 and an upper electrode 140. As the BST film 130, a film RF-sputtered at 400° C. or lower was used, and platinum was used to make the lower electrode 120 and the upper electrode 140. Also, as shown in FIG. 3, as to the relationship between the biasing direction and the direction of electron injection, electrons are injected from the lower electrode 120 to the upper electrode 140 at positive bias, whereas electrons are injected from the upper electrode 140 to the lower electrode 120 at a negative bias. The current leakage characteristics of such a capacitor device were evaluated, and the result is shown in FIG. 4.

As shown in FIG. 4, the current leakage characteristics exhibit a clear dependence on the biasing direction. At a positive bias, a mild upward curve is seen in the leakage current/capacitance density as the voltage increases, whereas at a negative bias, it is seen that the leakage current/capacitance density suddenly increases as the voltage (absolute value) increases. This demonstrates a tendency due to the crystallinity of the BST film.

Additionally, a drawing of a cross sectional, transmission electron microscope (TEM) photograph of the BST film 130 on which the above-mentioned measurements were made is shown in FIG. 2. The BST film 130 in its initial phase of formation, i.e., at an interface with the lower electrode 120 is amorphous, whereas its upper layer, i.e., at an interface with the upper electrode 140, is polycrystalline.

In the crystalline dielectric film, such as a BST film, formed at low temperature, the dependence of its current leakage characteristics on biasing is noticeably seen from a difference in crystallinity between the region grown initially and the upper layer grown thereafter in the film formation. Thus, deterioration of the current leakage characteristics at a negative bias imposes the problem of reliability. Also, its dependence on the biasing direction imposes a problem such as signal distortion at an RF (radio frequency) band. It is for this reason that improvements of the current leakage characteristics have been called for. And, if the current leakage characteristics can be improved by a method not inviting a decrease in the unit capacitance of the capacitor device, such a method is suitable since the performance of the crystalline dielectric film is not impaired.

SUMMARY OF THE INVENTION

The problem to be solved is the difficulty of improving the current leakage characteristics while maintaining the unit capacitance in view of the fact that the unit capacitance is a tradeoff for the leakage characteristics of the electrodes in a capacitor device that uses a crystalline dielectric film as a capacitor insulating film.

An object of the present invention is to improve the breakdown voltage by decreasing the leakage current at a negative bias, while maintaining the unit capacitance.

According to one embodiment of the present invention, a' semiconductor apparatus is provided with a crystalline dielectric film having a perovskite structure, between a first electrode and a second electrode. The semiconductor apparatus has at least a discontinuous interface, through which crystallinity becomes discontinuous, in a columnar crystal portion of the crystalline dielectric film.

According to one embodiment of the present invention, the discontinuous interface through which crystallinity becomes discontinuous is provided in the columnar crystal portion of the crystalline dielectric film. Hence, e.g., when a negative bias is applied on one of the electrodes, injection of electrons from the one of the electrodes to an electrode opposed thereto is blocked at the discontinuous interface, whereby the current leakage is decreased.

According to another embodiment of the present invention, there is provided a method of manufacturing a semiconductor apparatus provided with a crystalline dielectric film having a perovskite structure, between a first electrode and a second electrode. The method includes a step of forming a discontinuous interface, through which crystallinity becomes discontinuous, in a columnar crystal portion of the crystalline dielectric film, in forming the crystalline dielectric film.

According to the second embodiment of the present invention, the discontinuous interface through which crystallinity becomes discontinuous is formed in the columnar crystal portion of the crystalline dielectric film, in forming the crystalline dielectric film. Hence, e.g., when a negative bias is applied on one of the electrodes, the crystalline dielectric film is formed, in which injection of electrons from the one of the electrodes to an electrode opposed thereto is blocked at the discontinuous interface, whereby a semiconductor apparatus in which the current leakage is decreased can be manufactured.

According to the first embodiment of the present invention, the discontinuous interface through which crystallinity becomes discontinuous is provided in the columnar crystal region of the crystalline dielectric film having a perovskite structure. Hence, in the crystalline dielectric film of the present invention, the leakage current can be decreased as compared with a single-layer crystalline dielectric film having the same thickness. Consequently, there is an advantage that a highly reliable capacitor device can be implemented. Furthermore, by providing a layer of the crystalline dielectric film (e.g., a polycrystalline film) above the discontinuous interface, the leakage current can be decreased without degrading the unit capacitance. Furthermore, the leakage current at negative bias can be decreased, and substantially the same leakage characteristics can be obtained at both a positive and negative bias. Hence, not only the reliability of the capacitor device can be improved, but also its stable performance can be obtained with suppressed signal distortion at an RF (radio frequency) band.

According to the another embodiment of the present invention, the discontinuous interface through which crystallinity becomes discontinuous is formed in the columnar crystal region of the crystalline dielectric film having a perovskite structure. Hence, in the crystalline dielectric film of the present invention, the leakage current can be decreased as compared with a single-layer crystalline dielectric film having the same thickness. Consequently, a highly reliable capacitor device can be formed. Furthermore, by forming a layer of the crystalline dielectric film (e.g., a polycrystalline film) above the discontinuous interface, the capacitor device in which the leakage current is decreased can be formed without degrading the unit capacitance. Furthermore, in a semiconductor apparatus manufactured, the leakage current at a negative bias can be decreased, and substantially the same leakage characteristics can be obtained at both a positive and negative bias. Hence, not only the reliability of the capacitor device can be improved, but also its stable performance can be obtained with suppressed signal distortion at the RF (radio frequency) band.

BRIEF DESCRIPTION OF THE DRAWINGS

The present invention will become more readily appreciated and understood from the following detailed description of embodiments and examples of the present invention when taken in conjunction with the accompanying drawings, in which.

DESCRIPTION OF THE INVENTION

Figure 5:
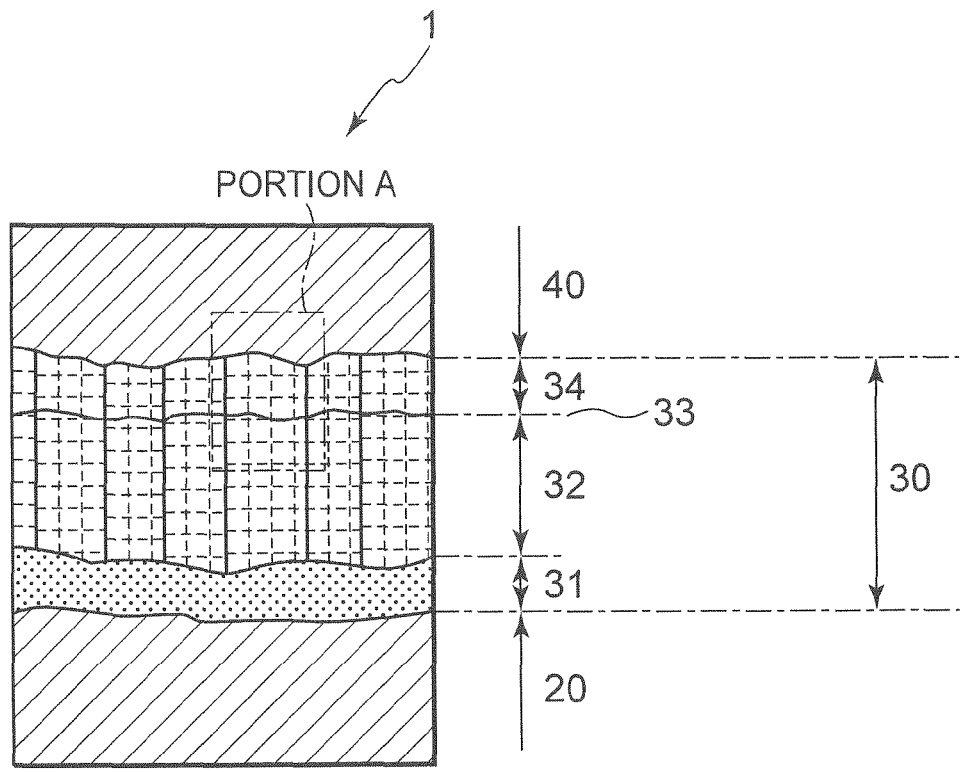
FIG. 5 is a schematic cross-sectional view showing an embodiment (first embodiment)

One embodiment (first embodiment) of the present invention will be described with reference to FIGS. 5 and 6. FIG. 5 is a schematic cross-sectional view showing a capacitor as an example of a capacitor device, and FIG. 6 shows a drawing of an enlarged TEM photograph of a portion A in FIG. 5.

Figure 6:
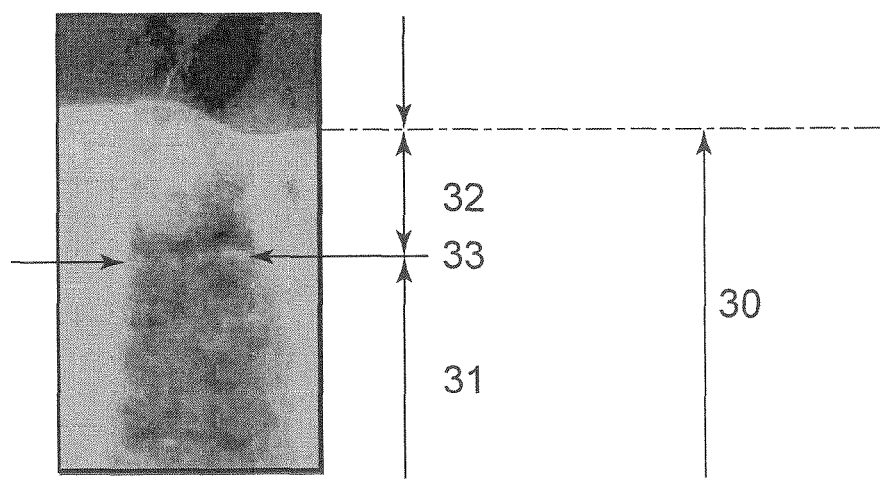
FIG. 6 is a drawing of an enlarged TEM photograph of a portion A in FIG. 5.

As shown in FIGS. 5 and 6, a first electrode 20 is formed on a substrate 10 (not shown). At least a surface of this first electrode 20 is preferably formed of a metal material, an alloy material, or a conductive oxide, considering its lattice matching during crystal growth of a capacitor insulating film 30. The metal material includes platinum (Pt) and ruthenium (Ru). The alloy material is prepared by mixing at least one kind selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$). Note that the substrate 10 may have an integrated circuit formed thereon, and that devices, such as transistors, and hence interconnections may be formed in layers below the first electrode 20. Also, the underlayer of the first electrode 20, y desirably, maybe an insulating film, (not shown), such as, e.g., one planarized by chemical mechanical polishing (CMP) or the like.

The capacitor insulating film 30 is formed on the first electrode 20. This capacitor insulating film 30 is formed mainly of a crystalline dielectric film having a perovskite structure, such as, e.g., strontium titanate ($SrTiO_3$, hereinafter abbreviated as STO), barium titanate ($BaTiO_3$, hereinafter abbreviated as BTO), barium strontium titanate ($Ba_xSr_{1-x}TiO_3$, hereinafter abbreviated as BST), or zirconium lead titanate ($PbZr_xTi_{1-x}O_3$, hereinafter abbreviated as PZT). In the following description, BST is taken as an example. This capacitor insulating film 30 made of BST was, e.g., 100 nm thick. And, it is important that its film forming temperature is not likely to cause the degradation in reliability or performance fluctuations of the transistors and interconnections formed prior to the film. Generally, the temperature is 350-400° C. or lower, although it also depends on the substrate structure.

In the capacitor insulating film 30, a discontinuous interface 33 through which the crystallinity becomes discontinuous is formed in a columnar crystal portion of the crystalline dielectric film. That is, the main portion of the capacitor insulating film 30 has a laminated structure formed of a first layer (hereinafter called "first layer") 32 of the crystalline dielectric film, the discontinuous interface 33, and a second layer (hereinafter called "second layer") 34 of the crystalline dielectric film. Also, below the first layer 32, an amorphous layer 31 is formed, which is produced when the first layer 32 is grown. Therefore, the capacitor insulating film 30 is virtually a film containing the amorphous layer 31.

A second electrode 40 is formed on the capacitor insulating film 30. At least a side of this second electrode 40 facing the capacitor insulating film 30 is formed of a film exhibiting satisfactory lattice matching with the capacitor insulating film 30. Such a film may be made of, e.g., a metal material, an alloy material, or a conductive oxide. The metal material includes platinum (Pt) and ruthenium (Ru). The alloy material is prepared by mixing at least one kind selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$).

Therefore, the whole part of the first electrode 20 and the second electrode 40 may be made of the above-mentioned metal material or conductive oxide.

When the capacitor insulating film 30 is formed at 400° C. or lower, the crystallinity of the film is impaired initially, but it gradually improves thereafter in the film formation process. Therefore, the lowermost layer of the capacitor insulating film 30 (on a side facing the first electrode 20) is the amorphous layer 31. From this amorphous layer 31, the dependence of the leakage current on biasing occurs. Furthermore, at an extremely low temperature (e.g., 50° C. or lower), the subsequent crystal growth of the crystalline dielectric film, of which the capacitor insulating film 30 is mainly formed, becomes very slow or even does not proceed. Thus, in order to obtain the advantage of the ferroelectric properties of the crystalline dielectric film, the temperature of the film formation including post-processing may preferably be 200° C. or higher.

Figure 1:
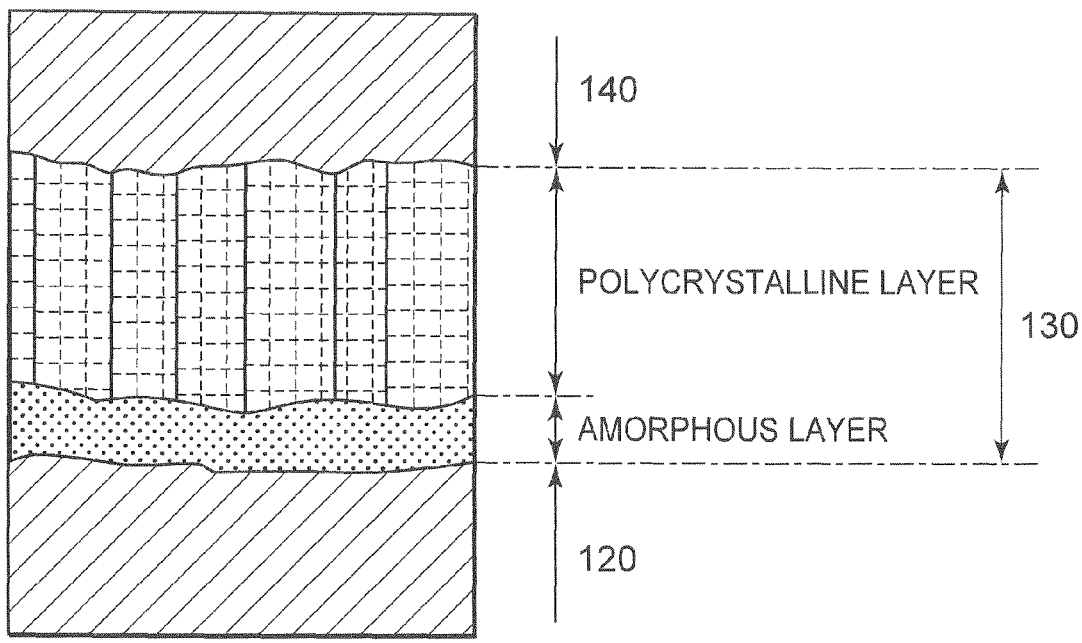
FIG. 1 is a schematic cross-sectional view showing the configuration of a capacitor device structure of a related art.
Figure 2:
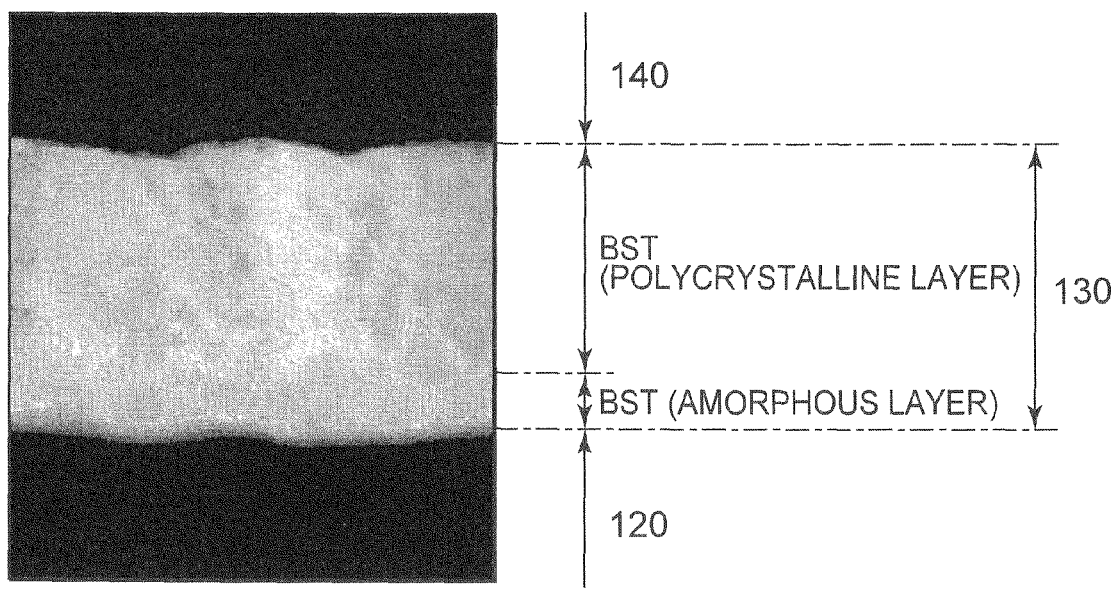
FIG. 2 is a drawing of a TEM cross-sectional photograph showing the capacitor device structure of the related art.
Figure 3:
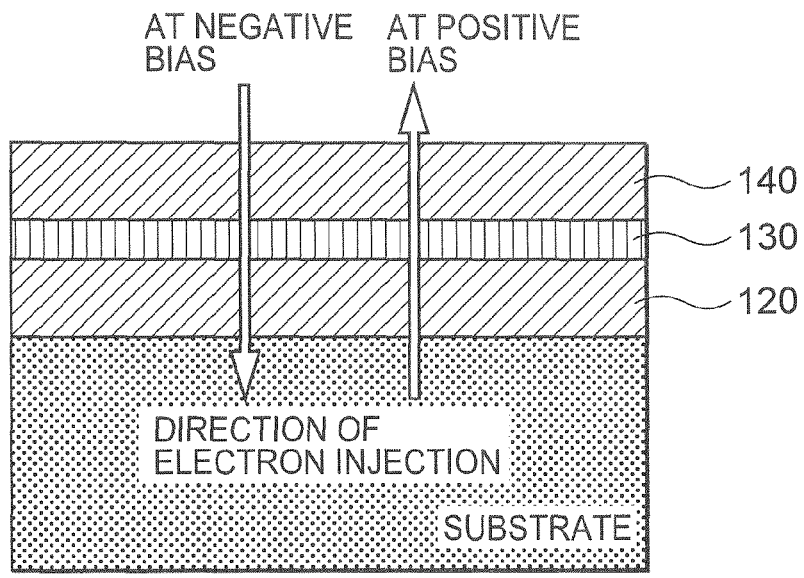
FIG. 3 is a diagram showing directions of electron injection based on biasing directions.

In the above-described semiconductor apparatus 1, the laminated structure, in which the discontinuous interface 33 is interposed between the first layer 32 and the second layer 34 is provided. That is, the discontinuous interface 33 is formed in the columnar crystal of the first layer 32 and the second layer 34. Here, the relation of leakage current/capacitance density with voltage was examined for the related art structure with no discontinuous interface, as shown earlier in FIG. 1, and the structure of the semiconductor apparatus 1 according to the present invention.

The result will be described with reference to FIG. 7. Note that BST films were used as their crystalline dielectric films. The crystalline dielectric film of the related art was 100 nm thick, whereas the crystalline dielectric film of the present invention was 100 nm thick in total, combining 70 nm for the first layer 32 with 30 nm for the second layer 34. Note that their amorphous layers formed initially in the film formation process had an equal thickness.

Figure 7:
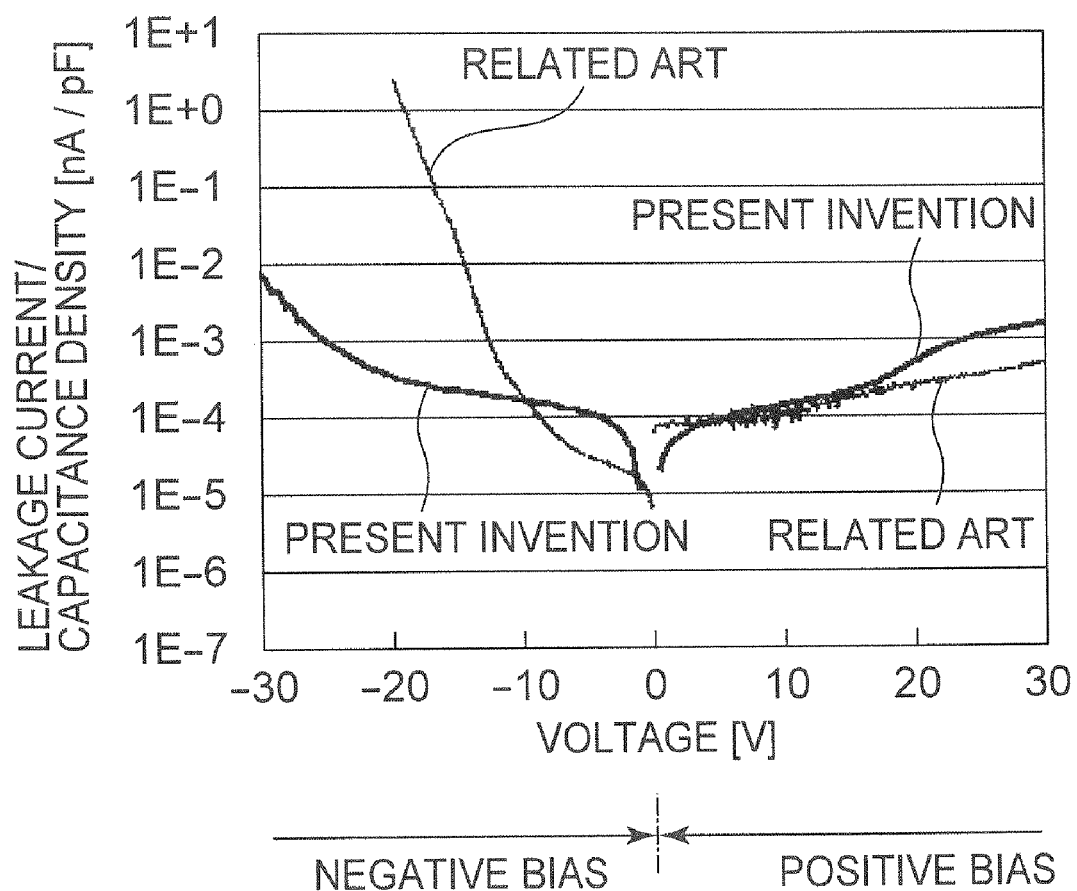
FIG. 7 is a diagram relating leakage current/capacitance density with biases in a comparison between the present invention and the related art.

As shown in FIG. 7, at a positive bias, both the structure according to the related art and the structure according to the present invention exhibited substantially equal leakage current characteristics, whereas at a negative bias, the structure according to the present invention exhibited improvements in the dependence on biasing, and a leakage current level was obtained which was substantially the same as that obtained at positive bias. Here, if leakage breakdown voltage is defined as a voltage at which either the positive or negative bias reaches a leakage current/capacitance density of $1\times10^{-2}$ (1E–2) nA/pF, a leakage breakdown voltage obtained from the related art structure is about 15V, whereas 30V (absolute value) or higher can be obtained from the semiconductor apparatus 1.

Figure 8A:
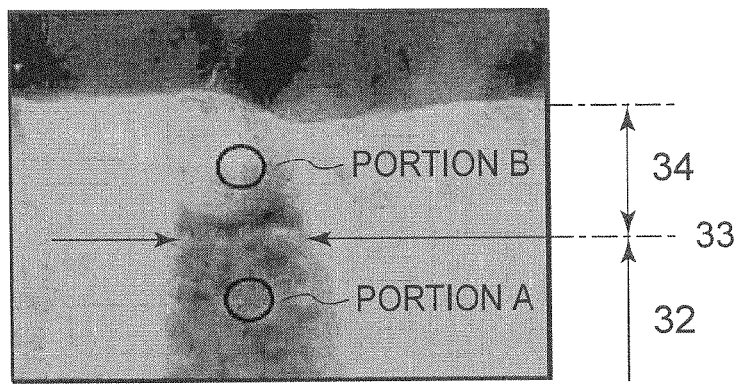
FIG. 8A is a drawing of a light-field TEM photograph of a section of a capacitor insulating film.
Figure 8B:
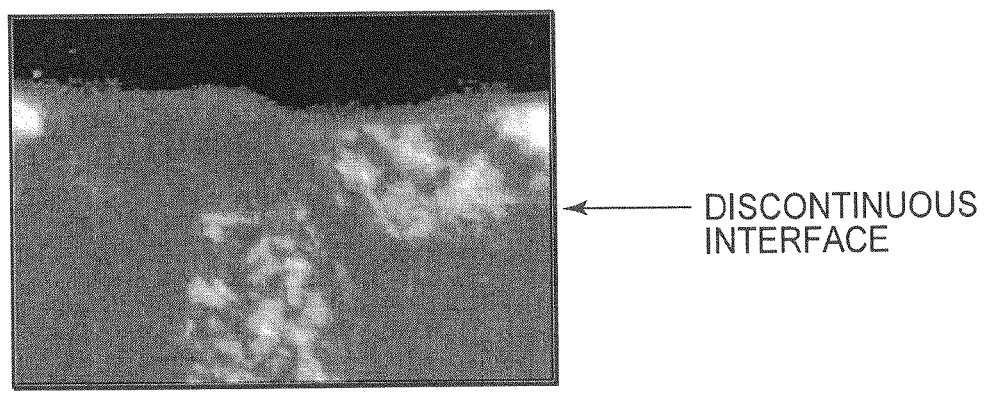
FIG. 8B is a drawing of a dark-field TEM photograph of the section of the capacitor insulating film.
Figure 8C:
FIG. 8C is a drawing of an electron diffraction photograph of a portion A in FIG. 8A.
Figure 8D:
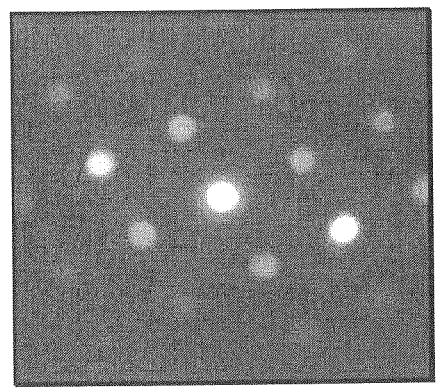
FIG. 8D is a drawing of an electron diffraction photograph of a portion B in FIG. 8A.

Here, the crystal structure of the first layer 32 and the second layer 34 formed above and below the discontinuous interface 33, respectively, was examined. The results will be described with reference to FIGS. 8A-8D. FIG. 8A is a drawing of a light-field TEM photograph of a cross section of the capacitor insulating film 30; FIG. 8B is a drawing of a dark-field TEM photograph of the cross section of the capacitor insulating film 30; FIG. 8C is a drawing of an electron diffraction photograph of a portion A in FIG. 8A; and FIG. 8D is a drawing of an electron diffraction photograph of a portion B in FIG. 8A.

As shown in FIGS. 8A-8D, the portion A is a part of the first layer 32, and the portion B is a part of the second layer 34. Hence, two points in regions above and below the discontinuous interface 33 formed between the first layer 32 and the second layer 34 were observed through the transmission electron micrographs. Apparently from FIGS. 8C and 8D, from the fact that diffraction spots are found in both points of observation, it is understood that both portions are crystallized. Additionally, from a clear difference found in their diffraction patterns, it is also seen that there is a difference in crystal orientation between the first layer 32 and the second layer 34. Thus, the discontinuous interface 33 may be formed on a condition that different crystal orientations are found in the crystalline dielectric film with the discontinuous interface 33 as a border. Also, from the drawing of the dark-field photograph shown in FIG. 8B, a clear difference in contrast is found even between the neighboring columnar crystal regions above and below the discontinuous interface to which attention was paid in the electron diffraction analysis, and from this, it is also seen that there is a difference in their crystal orientations.

Thus, the discontinuous interface 33 may be formed on the condition that the second layer 34 formed above the discontinuous interface 33 is made of a crystalline dielectric film having a crystal structure and that at least a part of the second layer 34 (or at least a part of the first layer 32) includes a region where the crystal orientation differs from that of the first layer 32 (or the second layer 34). And, by forming the discontinuous interface 33 in a manner spreading over the entire area bordered by the first layer 32 and the second layer 34, the leakage breakdown voltage can be improved.

Additionally, among the advantages of the laminated structure in which both layers above and below the discontinuous interface are crystallized is the fact that the unit capacitance does not decrease. Here, the structure of the related art was compared with the semiconductor apparatus of the present invention in terms of leakage breakdown voltage and unit capacitance. The result will be described with reference to FIG. 9.

Figure 9:
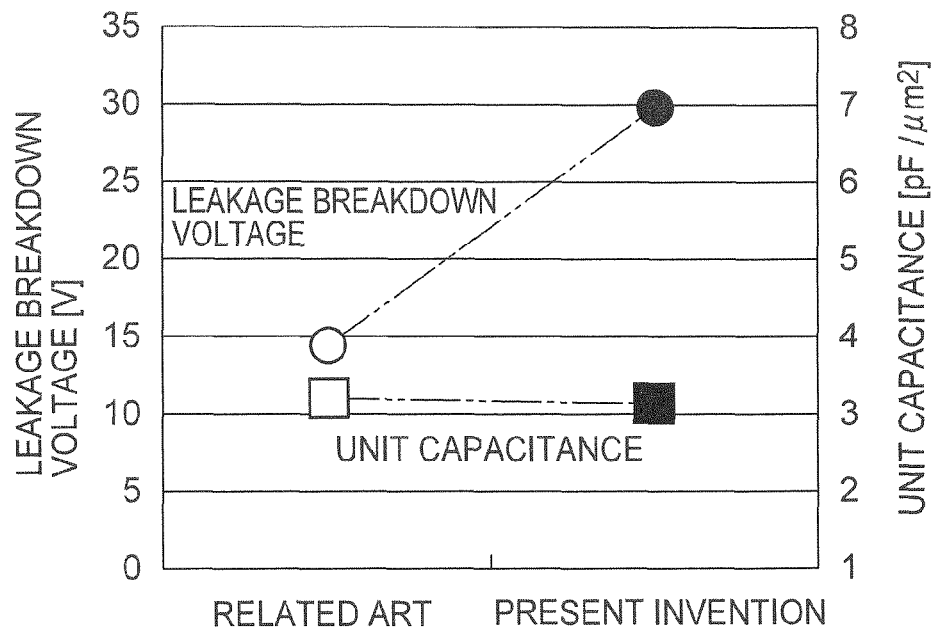
FIG. 9 is a diagram comparing the present invention with the related art in terms of leakage breakdown voltage and unit capacitance.

As shown in FIG. 9, the semiconductor apparatus of the present invention (indicated as a solid circle and a solid square) exhibits a unit capacitance substantially equal to that of the structure of the related art, whereas the structure of the related art (indicated by an empty circle and an empty square) exhibits an improvement of the leakage breakdown voltage from about 15V to about 30V.

Figure 10:
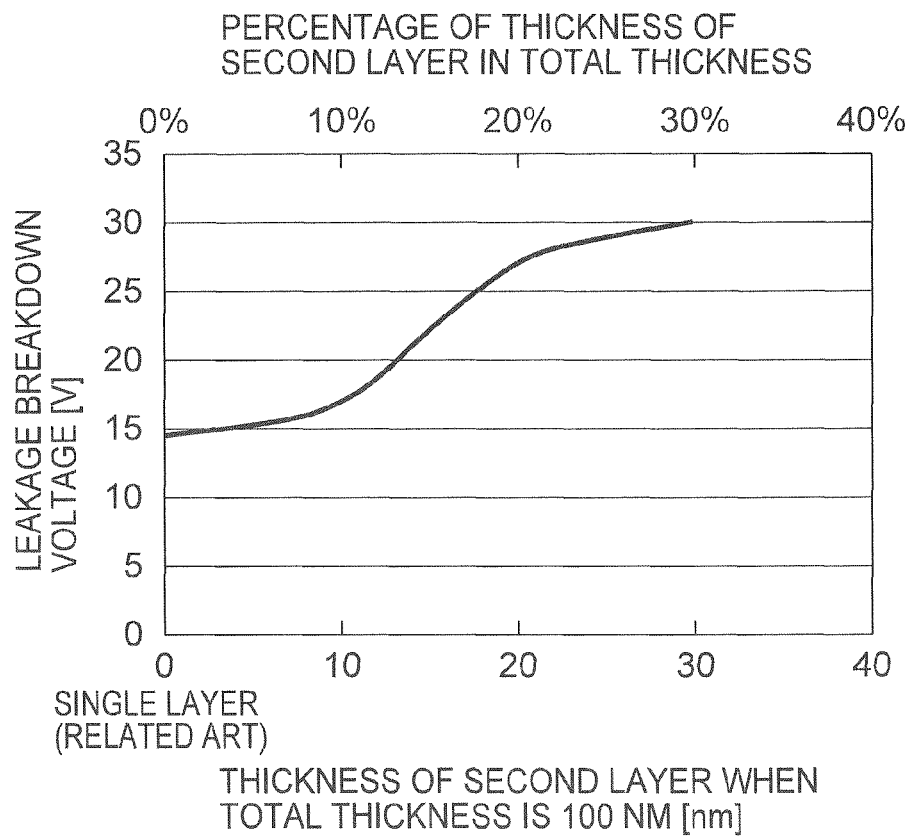
FIG. 10 is a diagram relating leakage breakdown voltage with the thickness of a second layer.

Also, how effectively the leakage current at a negative bias decreases depends on where the discontinuous interface 33 is located. Specifically, there is a minimum thickness requirement for the crystalline dielectric film portion above the discontinuous interface 33. Hence, the relation of the leakage breakdown voltage with the thickness of the second layer of the crystalline dielectric film was examined. The result is shown in FIG. 10. In FIG. 10, the ordinate indicates the leakage breakdown voltage and the abscissa indicates the thickness of the second layer. Furthermore, a BST crystalline dielectric film was used. Under the combined thickness of the first layer and the second layer being 100 nm, the thickness of the second layer was varied to make a measurement on the leakage breakdown voltage. Furthermore, similarly to the above, the leakage breakdown voltage was defined as a voltage at which either a positive or negative bias reaches a leakage current/capacitance density of $1\times10^{-2}$ nA/pF.

As shown in FIG. 10, the leakage breakdown voltage improves with the increasing thickness of the second layer. It is seen that the leakage breakdown voltage is about 27V when the second layer is 20 nm thick. Therefore, if the minimum thickness is set to 20 nm or more, it becomes possible to effectively decrease the leakage current at a negative bias. Note that when the thickness of the second layer is 0, i.e., when there is only the first layer, this is the case of the structure of the related art. In this case, the leakage breakdown voltage is about 15V. Hence, by providing a discontinuous interface between the first and second layers and by setting the thickness of the second layer to 20 nm or more, the leakage breakdown voltage is improved approximately twice that provided by the structure of the related art. When considering the fact that the crystalline dielectric film is used as a dielectric film for a capacitor device, and further, since the thickness at which the film functions as a capacitor insulating film is generally about 200 nm or less, a maximum thickness of the second layer can be determined from the total thickness of the crystalline dielectric film, which is 200 nm or less. Incidentally, when the first layer is 70 nm thick, the second layer should be 130 nm thick or less.

Also, the thicker the second layer becomes than the first layer, i.e., the larger the percentage of the second layer in the film becomes than the first layer, the better the leakage breakdown voltage becomes. As seen above in FIG. 10, the second layer preferably has a thickness at least 20% or more of the combined thickness of the first and second layers.

Figure 11:
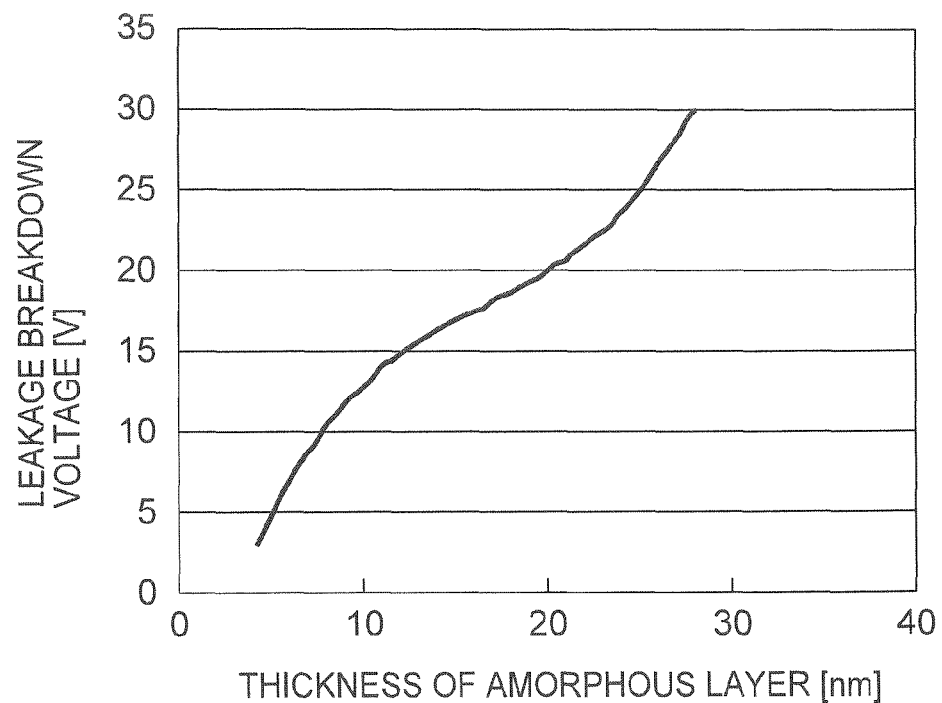
FIG. 11 is a diagram relating leakage breakdown voltage with the thickness of an amorphous layer.

Furthermore, during the formation of the first layer 32, the amorphous film 31 is formed on the first electrode 20. Although this amorphous film 31 is desirably thin since it decreases the dielectric constant, it should desirably have a certain thickness from the viewpoint of the leakage breakdown voltage. Hence, the relation of the leakage breakdown voltage with the thickness of the amorphous film was examined, and the result is shown in FIG. 11. Similarly to the above, the leakage breakdown voltage was defined as a voltage at which either a positive or negative bias reaches a leakage current/capacitance density of $1\times10^{-2}$ nA/pF.

As seen in FIG. 11, the leakage breakdown voltage reaches 30V when the amorphous layer is 28 nm thick. Therefore, it suffices that the amorphous layer is about 30 nm thick, from the viewpoint of the leakage breakdown voltage. Even if the amorphous layer is thinner than that, a leakage breakdown voltage of about 30V can be ensured by forming a discontinuous interface. Additionally, such an amorphous layer 31 results from the formation of the crystalline dielectric film at a low temperature of 400° C. or lower. What is important is to realize a decrease in leakage current by the laminated structure that has a discontinuous interface in the columnar crystal of a crystalline dielectric film having a perovskite structure. Therefore, even by forming a discontinuous interface in the columnar crystal of a crystalline dielectric film formed at high temperature, a similar advantage can be provided.

One technique therefor is to form a plurality of discontinuous interfaces. Additionally, it would be effective to form the discontinuous interface of, e.g., an amorphous layer having a composition similar to that of the crystalline dielectric film or a metal film or a metallic conductive film such as a conductive compound film in reliably ensuring the leakage breakdown voltage. These techniques will be described below.

Figure 12:
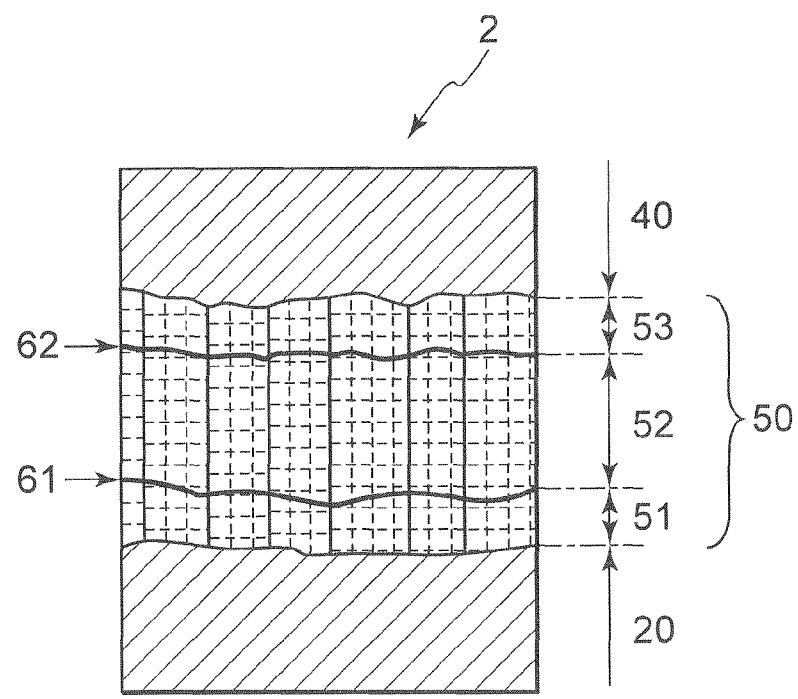
FIG. 12 is a schematic cross-sectional view showing a second embodiment, which is a semiconductor apparatus of the present invention.

First, a second embodiment, which is a semiconductor apparatus 2 of the present invention having a plurality of discontinuous interfaces, will be described with reference to FIG. 12, which is a schematic cross sectional view showing a general configuration. A structure shown in FIG. 12 is an example in which a plurality of discontinuous interfaces, specifically here, e.g., two discontinuous interfaces are formed.

While the laminated structure in which two layers of a crystalline dielectric film interpose a discontinuous interface therebetween has been described in the foregoing, a similar advantage can be obtained also by increasing the number of layers of the discontinuous interface. Furthermore, while an example of a film formed at low temperature has been described in the above-mentioned embodiment, what is important in the present invention is to realize a decrease in leakage current by providing a laminated structure in which a discontinuous interface is formed in the columnar crystal of a crystalline dielectric film having a perovskite structure. Therefore, a similar advantage can be provided even by a columnar crystal formed at high temperature. For example, as shown in FIG. 12, in the case of film formation at high temperature in which the amorphous layer 31 is not formed, a columnar crystal is grown over the entire region thickness-wise. And then, by forming discontinuous interfaces 61, 62 near the first electrode 20 and a second electrode 40, respectively, it becomes possible to decrease the leakage current at both biases, while maintaining the unit capacitance. The configuration will be described specifically below.

A first electrode 20 is formed on a substrate 10 (not shown). At least a surface of this first electrode 20 is preferably formed of a metal material, an alloy material, or a conductive oxide, considering its lattice matching during crystal growth of a capacitor insulating film 50. The metal material includes platinum (Pt) and ruthenium (Ru). The alloy material is prepared by mixing at least one kind selected from a group including nickel (Ni), tantalum (Ta), and niobium (Nb) with aluminum (Al), to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$). Note that the substrate 10 may have an integrated circuit formed thereon and devices, such as transistors, and interconnections may be formed in layers below the first electrode 20. Also, the underlayer of the first electrode 20 may desirably be an insulating film (not shown), such as, e.g., one planarized by chemical mechanical polishing (CMP) or the like.

The capacitor insulating film 50 is formed on the first electrode 20. This capacitor insulating film 50 is formed mainly of a crystalline dielectric film having a perovskite structure, such as, e.g., strontium titanate ($SrTiO_3$, hereinafter abbreviated as STO), barium titanate ($BaTiO_3$, hereinafter abbreviated as BTO), barium strontium titanate ($Ba_xSr_{1-x}TiO_3$, hereinafter abbreviated as BST), or zirconium lead titanate ($PbZr_xTi_{1-x}O_3$, hereinafter abbreviated as PZT). In the following description, BST is taken as an example. This capacitor insulating film 50 made of BST was, e.g., 100 nm thick. And, it is important that its film forming temperature is not likely to cause degradation in reliability or performance fluctuations of the transistors and interconnections formed prior to the film. Generally, the temperature is 350-400° C. or lower, although it depends also on the substrate structure.

In the capacitor insulating film 50, a number of (here two,) discontinuous interfaces 61, 62 through which the crystallinity becomes discontinuous are formed in a columnar crystal portion of the crystalline dielectric film near the first and second electrodes 20, 40, respectively. These discontinuous interfaces 61, 62 are located 20 nm or more spaced apart from the first and second electrodes 20, 40, respectively, similarly to the case described earlier with reference to FIG. 10.

Thus, the main portion of the capacitor insulating film 50 has a laminated structure formed of a first layer (hereinafter called "first layer") 51 of the crystalline dielectric film, the discontinuous interface 61, a second layer (hereinafter called "second layer") 52 of the crystalline dielectric film, the discontinuous interface 62, and a third layer (hereinafter called "third layer") 53 of the crystalline dielectric film.

The second electrode 40 is formed on the capacitor insulating film 50. At least a side of this second electrode 40 facing the capacitor insulating film 50 is formed of a film exhibiting satisfactory lattice matching with the capacitor insulating film 50. Such a film may be made of, e.g., a metal material, an alloy material, or a conductive oxide. The metal material includes platinum (Pt) and ruthenium (Ru). The alloy material is prepared by mixing at least one kind selected from a group including nickel (Ni), tantalum (Ta), and niobium (Nb), with aluminum (Al), to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$). Therefore, the whole part of the first electrode 20 and the second electrode 40 may be made of the above-mentioned metal material or conductive oxide.

In the above-described semiconductor apparatus 2, the laminated structure is provided in which the first layer 51, the second layer 52, and the third layer 53 of the crystalline dielectric film interpose the discontinuous interfaces 61, 62, respectively, in order to decrease the leakage current at negative bias. That is, the discontinuous interfaces 61, 62 are formed in the columnar crystal portion of the first layer 51 to the third layer 53. Therefore, the leakage breakdown voltage is improved by the discontinuous interfaces 61, 62. Also, since the first layer 51 to the third layer 53 compose the crystalline dielectric film, the laminated structure exhibits almost no decrease in unit capacitance when compared with the structure in which the capacitor insulating film 50 is formed as a single-layer crystalline dielectric film.

Next, a third embodiment, which is a semiconductor apparatus 3 of the present invention, will be described with reference to FIG. 13, which is a schematic cross-sectional view showing a general configuration. A structure shown in FIG. 13 is an example in which a discontinuous interface is formed of an amorphous layer.

Figure 13:
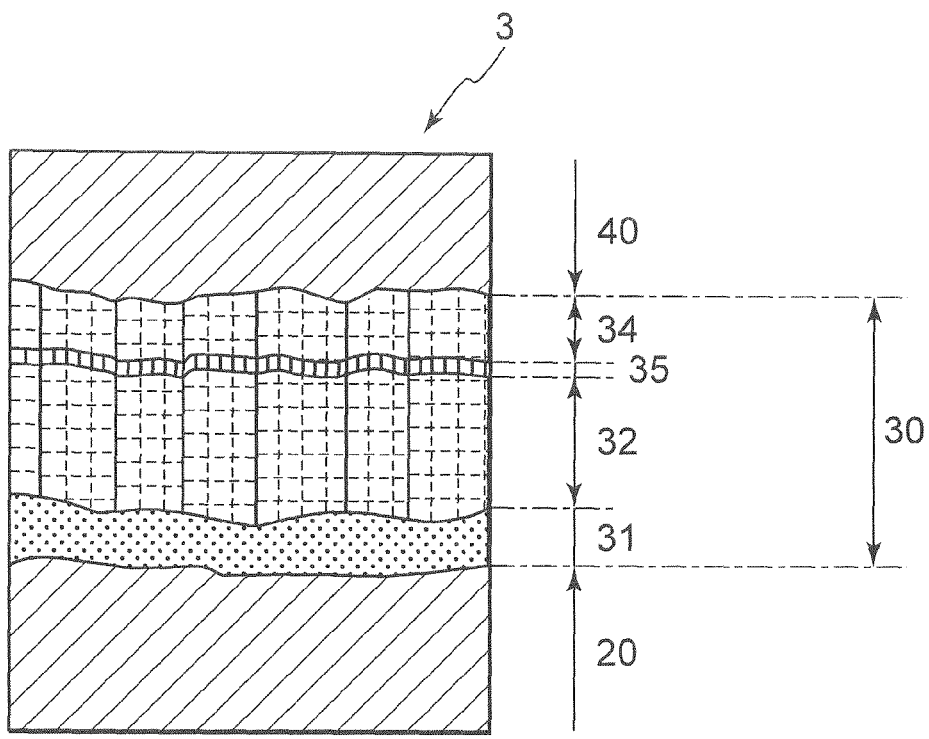
FIG. 13 is a schematic cross-sectional view showing a third embodiment, which is a semiconductor apparatus of the present invention.

As shown in FIG. 13, a first electrode 20 is formed on a substrate 10 (not shown). At least a surface of this first electrode 20 is preferably formed of a metal material, an alloy material, or a conductive oxide, considering its lattice matching during crystal growth of a capacitor insulating film 30. The metal material includes platinum (Pt) and ruthenium (Ru). The alloy material is prepared by mixing at least one kind selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$). Note that the substrate 10 may have an integrated circuit formed thereon, and that devices, such as transistors, and interconnections may be formed in layers below the first electrode 20. Also, the underlayer of the first electrode 20 may desirably be an insulating film (not shown), such as, e.g., one planarized by chemical mechanical polishing (CMP) or the like.

The capacitor insulating film 30 is formed on the first electrode 20. This capacitor insulating film 30 is formed mainly of a crystalline dielectric film having a perovskite structure, such as, e.g., strontium titanate ($SrTiO_3$, hereinafter abbreviated as STO), barium titanate ($BaTiO_3$, hereinafter abbreviated as BTO), barium strontium titanate ($Ba_xSr_{1-x}TiO_3$, hereinafter abbreviated as BST), or zirconium lead titanate ($PbZr_xTi_{1-x}O_3$, hereinafter abbreviated as PZT). In the following description, BST is taken as an example. This capacitor insulating film 30 made of BST is, e.g., 100 nm thick. And, it is important that its film forming temperature is not likely to cause the degradation of reliability or performance fluctuations of the transistors and interconnections formed prior to the film. Generally, the temperature is 350-400° C. or lower, although it depends also on the substrate structure.

In the capacitor insulating film 30, an amorphous layer 35 through which the crystallinity becomes discontinuous is formed in a columnar crystal portion of the crystalline dielectric film. This amorphous layer 35 is an amorphous layer having a composition similar to that of the crystalline dielectric film. Thus, the main portion of the capacitor insulating film 30 has a laminated structure formed of a first layer 32 of the crystalline dielectric film, the amorphous layer 35, and a second layer 34 of the crystalline dielectric film.

A second electrode 40 is formed on the capacitor insulating film 30. At least a side of this second electrode 40 facing the capacitor insulating film 30 is formed of a film exhibiting satisfactory lattice matching with the capacitor insulating film 30. Such a film may be made of, e.g., a metal material, an alloy material, or a conductive oxide. The metal material includes platinum (Pt) and ruthenium (Ru). The alloy material is prepared by mixing at least one kind of metal selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$).

Therefore, the whole part of the first electrode 20 and the second electrode 40 may be made of the above-mentioned metal material or conductive oxide.

In the above-described semiconductor apparatus 3, the laminated structure is provided in which the first layer 32 and the second layer 34 of the crystalline dielectric film interpose the amorphous layer 35 which is a discontinuous interface, in order to decrease the leakage current at a negative bias. That is, the amorphous layer 35 which is a discontinuous interface is formed in the columnar crystal portion of the first layer 32 and the second layer 34. Therefore, the leakage breakdown voltage is improved by the amorphous layer 35. Also, since the first layer 32 and the second layer 34 compose the crystalline dielectric film, the laminated structure exhibits almost no decrease in unit capacitance when compared with the structure in which the capacitor insulating film 30 is formed of a single-layer crystalline dielectric film.

Next, a fourth embodiment, which is a semiconductor apparatus 4 of the present invention, will be described with reference to FIG. 14, which is a schematic cross-sectional view showing a general configuration. A structure shown in FIG. 14 is an example in which a discontinuous interface is formed of a metallic conductive film.

Figure 14:
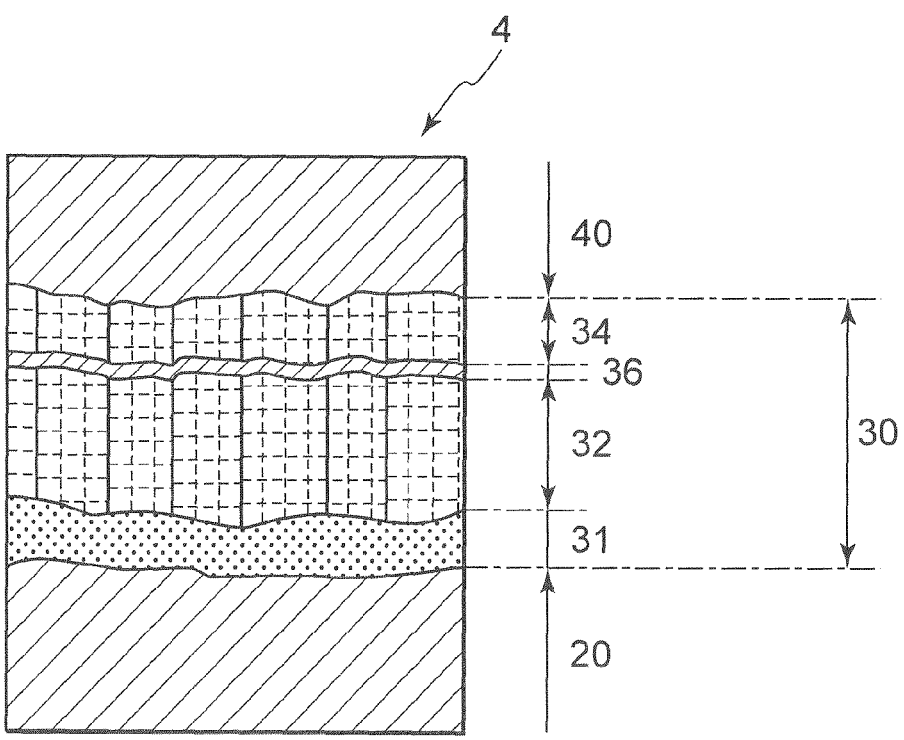
FIG. 14 is a schematic cross-sectional view showing a fourth embodiment, which is a semiconductor apparatus of the present invention.

As shown in FIG. 14, a first electrode 20 is formed on a substrate 10 (not shown). At least one surface of this first electrode 20 is preferably formed of a metal material, an alloy material, or a conductive oxide, considering its lattice matching during crystal growth of a capacitor insulating film 30. The metal material includes platinum (Pt) and ruthenium (Ru). The alloy material is prepared by mixing at least one kind of metal selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$). Note that the substrate 10 may have an integrated circuit formed thereon, and that devices, such as transistors, and interconnections may be formed in layers below the first electrode 20. Also, the underlayer of the first electrode 20 may desirably be an insulating film (not shown), such as, e.g., one planarized by chemical mechanical polishing (CMP) or the like.

The capacitor insulating film 30 is formed on the first electrode 20. This capacitor insulating film 30 is formed mainly of a crystalline dielectric film having a perovskite structure, such as, e.g., strontium titanate ($SrTiO_3$, hereinafter abbreviated as STO), barium titanate ($BaTiO_3$, hereinafter abbreviated as BTO), barium strontium titanate ($Ba_xSr_{1-x}TiO_3$, hereinafter abbreviated as BST), or zirconium lead titanate ($PbZr_xTi_{1-x}O_3$, hereinafter abbreviated as PZT). In the following description, BST is taken as an example. This capacitor insulating film 30 made of BSTis, e.g., 100 nm thick. And, it is important that its film forming temperature is not likely to cause the degradation in reliability or performance fluctuations of the transistors and interconnections formed prior to the film. Generally, the temperature is 350-400° C. or lower, although it depends also on the substrate structure.

In the capacitor insulating film 30, a metallic conductive film 36 through which the crystallinity becomes discontinuous is formed in a columnar crystal portion of the crystalline dielectric film. This metallic conductive film 36 is made of, e.g., a metal film, a conductive oxide film, or the like. For example, a metal material such as platinum (Pt) or ruthenium (Ru), or an alloy material prepared by mixing at least one kind selected from a group including nickel (Ni), tantalum (Ta), and niobium (Nb) with aluminum (Al) to match their lattice constants, or a conductive oxide such as ruthenium oxide ($RuO_2$), strontium ruthenium oxide ($SrRuO_3$), or lanthanum-containing oxide (e.g., $La_{1-x}SrxMnO_3$), may be used.

Thus, the main portion of the capacitor insulating film 30 has a laminated structure formed of a first layer 32 of the crystalline dielectric film, the metallic conductive film 36, and a second layer 34 of the crystalline dielectric film.

A second electrode 40 is formed on the capacitor insulating film 30. At least a side of this second electrode 40 facing the capacitor insulating film 30 is formed of a film exhibiting satisfactory lattice matching with the capacitor insulating film 30. Such a film may be made of, e.g., a metal material, an alloy material, or a conductive oxide. The metal material includes platinum (Pt) and ruthenium (Ru). The alloy material is prepared by mixing at least one kind selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}SrxMnO_3$).

Therefore, the whole part of the first electrode 20 and the second electrode 40 may be made of the above-mentioned metal material or conductive oxide.

In the above-described semiconductor apparatus 4, the laminated structure is provided in which the first layer 32 and the second layer 34 of the crystalline dielectric film interpose the metallic conductive film 36 which is a discontinuous interface in order to decrease the leakage current at negative bias. That is, the metallic conductive film 36 which is a discontinuous interface is formed in the columnar crystal portion of the first layer 32 and the second layer 34. Therefore, the leakage breakdown voltage is improved by the metallic conductive film 36. Also, since the first layer 32 and the second layer 34 compose the crystalline dielectric film, the laminated structure exhibits almost no decrease in unit capacitance when compared with the structure in which the capacitor insulating film 30 is formed of a single-layer crystalline dielectric film Next, an embodiment (fifth embodiment) of the present invention will be described with reference to FIG. 5 shown earlier.

As shown in FIG. 5, the first electrode 20 is formed on the substrate 10 (not shown). Preferably at least one surface of this first electrode 20 is formed of a metal material, an alloy material, or a conductive oxide, considering its lattice matching during crystal growth of the capacitor insulating film 30. The metal material includes platinum (Pt) and ruthenium (Ru). The alloy material is prepared by mixing at least one kind selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_xMnO_3$). Note that the substrate 10 may have an integrated circuit formed thereon, and that devices, such as transistors, and interconnections may be formed in layers below the first electrode 20. Also desirably, the underlayer of the first electrode 20 may be an insulating film (not shown), such as, e.g., one planarized by chemical mechanical polishing (CMP) or the like.

Then, the capacitor insulating film 30 is formed on the first electrode 20. This capacitor insulating film 30 is formed mainly of a crystalline dielectric film having a perovskite structure, such as, e.g., strontium titanate ($SrTiO_3$, hereinafter abbreviated as STO), barium titanate ($BaTiO_3$, hereinafter abbreviated as BTO), barium strontium titanate ($Ba_xSr_{1-x}TiO_3$, hereinafter abbreviated as BST), or zirconium lead titanate hereinafter abbreviated as PZT). In the following description, BST is taken as an example. This capacitor insulating film 30 made of BST is, e.g., 100 nm thick. And since it is important that its film forming temperature is not likely to cause the reliability degradation or performance fluctuations of the transistors and interconnections formed prior to the film, the temperature is, generally, 350-400° C. or lower, although it also depends on the substrate structure.

Figure 4:
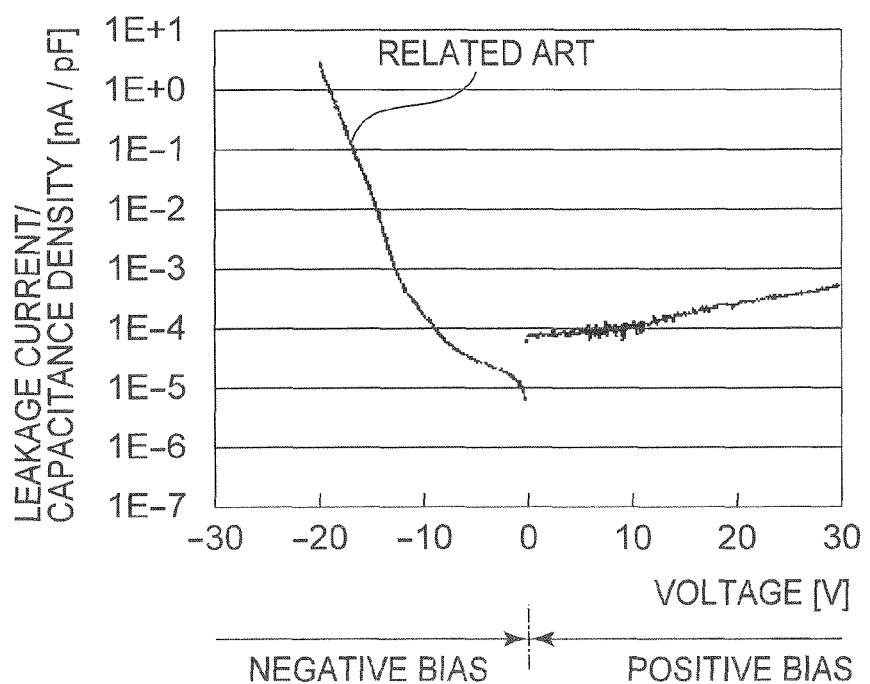
FIG. 4 is a diagram relating leakage current/capacitance density with biases in the related art.

The crystallinity of the BST film formed within this temperature range is unsatisfactory initially, but gradually improves thereafter, from which the dependence of its leakage current on biasing occurs as shown earlier with reference to FIG. 4. However, at an extremely low temperature, its subsequent crystal growth does not even proceed. In this case, the advantage of ferroelectric properties of the crystalline dielectric film cannot be obtained, and hence the temperature of the film formation including post-processing may be preferably 200° C. or higher.

In the capacitor insulating film 30, the discontinuous interface 33 through which the crystallinity becomes discontinuous is formed in a columnar crystal portion of the crystalline dielectric film. A method of forming this discontinuous interface 33 will be described below.

The discontinuous interface 33 is obtained as follows. During formation of the crystalline dielectric film, the film formation is temporarily stopped at a position where the discontinuous interface is to be formed, and the substrate temperature is decreased. A drop of 20° C. or so is adequate. Thereafter, the formation of the crystalline dielectric film is resumed, whereby the discontinuous interface 33 is obtained. Specifically, the following techniques are available.

During the formation of the crystalline dielectric film, the substrate 10 on which the film is formed is heated. And, when the film formation is interrupted, the substrate is taken out of a film forming chamber to decrease the substrate temperature. Thereafter, the substrate is put into the film forming chamber again to resume the formation of the crystalline dielectric film. The process step of taking the substrate out of the film forming chamber may effectively be performed by taking the substrate completely out of the film forming chamber, but this technique is not desirable from the viewpoint of productivity and contamination of the substrate. In view of this, other effective techniques may be employed which include taking the substrate out to a transporting chamber, such as a load-lock chamber, to decrease the substrate temperature, putting the substrate into another processing chamber whose temperature is lower than the film forming temperature in the system, and cooling a substrate supporting stage to decrease the substrate temperature, for example. Note that, in the case of dropping the stage temperature, it may be desirable to make the stage heatable by a stage heating means provided within the stage at the time the film formation is resumed.

In these techniques for decreasing the substrate temperature, it becomes difficult to faithfully reproduce the condition under which the film was formed immediately before the interruption of the film formation, due to thermal contraction, thermal expansion, and the like associated with the temperature change of the substrate and the crystalline dielectric film. This is why a crystalline discontinuous surface can be formed effectively at the interface of the crystalline dielectric film before and after the resumption of the film formation when the film formation of the crystalline dielectric films is resumed.

The effective temperature change of the substrate is, as described above, one of factors by which the two-layer structure for decreasing the leakage current is formed by first interrupting the formation of the crystalline dielectric film during the formation and then resuming the formation. For example, affected by the electron temperature in a plasma or the like, the surface temperature of the substrate becomes higher during the film formation than at the beginning. At this point of the process, the film formation is interrupted temporarily. Then, it becomes extremely difficult to faithfully restore exactly the same condition to which the surface temperature was adjusted before the interruption. This temperature change is one of the factors by which the laminated structure is formed which has a discontinuous interface in the columnar crystal portion of the crystalline dielectric film. In order to obtain the improvements in leakage breakdown voltage described in the present embodiment, it is preferable to drop the effective surface temperature of the substrate by 20° C. or more between the interruption and the resumption of the film formation.

One effective technique for forming the laminated structure having the interface at which the crystallinity is discontinuous is, as mentioned earlier, to change the film forming temperature during the formation of the crystalline dielectric film. If, e.g., the film forming system uses a resistance heating type stage heater as the substrate heating means, when the discontinuous interface is formed in the laminated structure by means of spontaneous cooling, the productivity may likely be impaired greatly. For example, if the leakage current does not decrease sufficiently even when the substrate is spontaneously cooled for 30 minutes, the substrate needs to be cooled more. A solution to this problem may be to use a means such as, e.g., a stage heater having a smaller heat capacity, or a stage structure having a high cooling efficiency, such as by circulating a coolant (e.g., cooling water, cooling gas, liquefied gas, or the like) within the stage.

Furthermore, a mechanism by which the flow rate of the coolant can be varied during the film formation and during the interruption of the film formation, or to increase the temperature change during the interruption of the film formation by a means such as a cooling fan, may also be effective. Still furthermore, measures such as turning off an electrostatic chuck during the interruption of the film formation, or temporarily lifting the substrate from the stage by means of a transporting mechanism, could be taken even by the existing system.

Meanwhile, an effective temperature change can be implemented by heating with a lamp. In the case of heating with a lamp, the temperature changes so smoothly that this is an effective means for forming the discontinuous interface efficiently. Specifically, either the output of the lamp is decreased or the lamp is temporarily turned off when the film formation is interrupted, and by doing so, the effective temperature of the substrate can be decreased quickly and effectively.

As another means for forming the discontinuous interface under higher controllability, it is effective to form a thin film whose crystallinity is extremely unsatisfactory between two layers of a crystalline dielectric film. This is, e.g., the structure in which the thin amorphous layer 35 is formed in the crystalline dielectric film (between the first layer 32 and the second layer 34) described earlier with reference to FIG. 13.

A technique for forming this amorphous layer 35 is to reduce the RF power of, e.g., an RF-magnetron sputtering system. Specifically, the RF power is reduced to ⅔ or less. When the power is reduced, so is the film forming rate. Therefore, when the amorphous layer 35 is thick, the productivity deteriorates significantly. Furthermore, in order to obtain the advantage of a sufficient decrease in leakage current while suppressing a decrease in unit capacitance, this amorphous layer 35 is desirably formed to be at least not less than 3 nm thick nor more than 10 nm thick. If this amorphous layer 35 is less than 3 nm thick, the thickness controllability is impaired, whereas if it is more than 10 nm thick, the dielectric constant drops excessively. Hence, the thickness of the amorphous layer 35 is preferably within the above-mentioned range.

Furthermore, the amorphous layer can be formed using parameters other than the RF power. For example, the amorphous layer 35 can be formed effectively by changing the film forming temperature or the degree of vacuum. Particularly, if the degree of vacuum is deteriorated extremely, the speed of incidence of argon (Ar) particles for sputtering a target or the energy of the sputtered particles released from the target decrease, and hence a less crystalline film can be formed.

Another technique is available to form a more complete discontinuous interface than the amorphous layer. That is, after interrupting the film formation of the crystalline dielectric film (the first layer 32), the metallic conductive film 36 is formed using, e.g., a metal material, an alloy material, or a conductive oxide. The metal material includes platinum (Pt) and ruthenium (Ru). The alloy material is prepared by mixing at least one kind selected from a group including nickel (Ni), tantalum (Ta), and niobium (Nb) with aluminum (Al) to match their lattice constants. The conductive oxide includes ruthenium oxide ($RuO_2$), strontium ruthenium oxide ($SrRuO_3$), and lanthanum-containing oxide (e.g., $La_{1-x}Sr_x MnO_3$). Thereafter, on the metallic conductive film 36, the crystalline dielectric film (the second layer 34) is formed again, whereby a more conspicuous discontinuous interface can be formed. This technique is effective to eliminate the problem of the decrease in unit capacitance resulting from a decrease in dielectric constant that occurs when the amorphous layer 35 is formed. The metallic conductive film 36 is formed in order to obtain the discontinuity, and hence it is desirably 50 nm thick or less. Even the metallic conductive film 36, which is about 5 nm thick or less, can provide an advantage that the leak current is sufficiently decreased.

While the case where the crystalline dielectric film was made of BST has been described in each of the above embodiments, a crystalline dielectric film made of other materials may also provide advantages similar to those provided by BST.

The present invention contains subject matter related to Japanese Patent Application No. JP2006-051895 filed in the Japanese Patent Office on Feb. 28, 2006, the entire contents of which are incorporated herein by reference.

What is claimed is:

1. A semiconductor apparatus provided with a crystalline dielectric film having a perovskite structure, between a first electrode and a second electrode, the semiconductor apparatus comprising:
   a discontinuous interface, through which crystallinity becomes discontinuous, in a columnar crystal portion of the crystalline dielectric film,
   wherein the columnar crystal portion of the crystalline dielectric film includes a region laminated above and a region laminated below the discontinuous interface.

2. The semiconductor apparatus according to claim 1, wherein the region laminated above the discontinuous interface has a crystal structure, and
   the region having the crystal structure is 20 nm or more in thickness and the crystalline dielectric film is 200 nm or less in total thickness.

3. The semiconductor apparatus according to claim 1, wherein a region laminated above the discontinuous interface has a crystal structure, and
   at least a part of the region above and a part of a region below the discontinuous interface has a region whose crystal orientation differs.

4. The semiconductor apparatus according to claim 1, wherein at least a part of the discontinuous interface is formed of an amorphous layer.

5. The semiconductor apparatus according to claim 1, wherein at least a part of the discontinuous interface is formed of a metal film or a conductive oxide film.

6. The semiconductor apparatus according to claim 1, wherein a plurality of discontinuous interfaces are formed.

7. The semiconductor apparatus according to claim 1, wherein an amorphous film is formed between the first electrode and the crystalline dielectric film.

8. A method of manufacturing a semiconductor apparatus including forming a crystalline dielectric film having a perovskite structure, between a first electrode and a second electrode, the method comprising:
   forming a discontinuous interface, through which crystallinity becomes discontinuous, in a columnar crystal portion of the crystalline dielectric film,
   wherein the columnar crystal portion of the crystalline dielectric film includes a region laminated above and a region laminated below the discontinuous interface.

9. The method of manufacturing a semiconductor apparatus according to claim 8, wherein the discontinuous interface is formed by temporarily decreasing a temperature during formation of the crystalline dielectric film, and thereafter resuming the formation.

10. The method of manufacturing a semiconductor apparatus according to claim 8, wherein the discontinuous interface is formed by changing a film forming pressure during formation of the crystalline dielectric film, in forming the crystalline dielectric film by an RF sputtering method.

11. The method of manufacturing a semiconductor apparatus according to claim 8, wherein a region having a crystal structure is formed above the discontinuous interface, and
   a region whose crystal orientation differs is formed in at least a part of the region above and a part of a region below the discontinuous interface.

12. The method of manufacturing a semiconductor apparatus according to claim 8, wherein at least a part of the discontinuous interface is formed of an amorphous layer.

13. The method of manufacturing a semiconductor apparatus according to claim 8, wherein at least a part of the discontinuous interface is formed of a metallic conductive film.

14. The method of manufacturing a semiconductor apparatus according to claim 8, wherein a plurality of discontinuous interfaces are formed.

15. The method of manufacturing a semiconductor apparatus according to claim 8, wherein the crystalline dielectric film having the discontinuous interface is formed at 400° C. or lower, and
   an amorphous film is formed between the first electrode and the crystalline dielectric film.

* * * * *